United States Patent
Koshimizu et al.

(10) Patent No.: US 12,266,727 B2
(45) Date of Patent: *Apr. 1, 2025

(54) SEMICONDUCTOR DEVICE AND METHOD OF MANUFACTURING THE SAME

(71) Applicant: RENESAS ELECTRONICS CORPORATION, Tokyo (JP)

(72) Inventors: Makoto Koshimizu, Tokyo (JP); Yasutaka Nakashiba, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/490,473

(22) Filed: Oct. 19, 2023

(65) Prior Publication Data
US 2024/0047576 A1 Feb. 8, 2024

Related U.S. Application Data

(63) Continuation of application No. 17/380,682, filed on Jul. 20, 2021, now Pat. No. 11,830,944.

(51) Int. Cl.
*H01L 29/78* (2006.01)
*H01L 29/04* (2006.01)
*H01L 29/66* (2006.01)

(52) U.S. Cl.
CPC ........ *H01L 29/7816* (2013.01); *H01L 29/045* (2013.01); *H01L 29/66681* (2013.01)

(58) Field of Classification Search
CPC ............... H01L 29/7816; H01L 29/045; H01L 29/66681; H01L 29/0653; H01L 29/41766;

(Continued)

(56) References Cited

U.S. PATENT DOCUMENTS

2006/0138549 A1 6/2006 Ko
2012/0094457 A1 4/2012 Gabreys
(Continued)

FOREIGN PATENT DOCUMENTS

CN 111969065 A 11/2020

OTHER PUBLICATIONS

U.S. PTO Non-Final Office Action issued in related U.S. Appl. No. 17/380,682, dated Apr. 13, 2023.
(Continued)

*Primary Examiner* — Mohammed R Alam
(74) *Attorney, Agent, or Firm* — Rimon P.C.

(57) ABSTRACT

The source region, drain region, buried insulating film, gate insulating film, and gate electrode of the semiconductor device are formed in a main surface of a semiconductor substrate. The buried insulating film is buried in a first trench formed between the source and drain regions. The first trench has a first side surface and a first bottom surface. The first side surface faces the source region in a first direction extending from one of the source and drain regions to the other. The first bottom surface is connected to the first side surface and is along the main surface of the semiconductor substrate. A crystal plane of a first surface of the semiconductor substrate, which is the first side surface of the first trench, is (111) plane. A crystal plane of a second surface of the semiconductor substrate, which is the bottom surface of the first trench, is (100) plane.

5 Claims, 12 Drawing Sheets

(58) Field of Classification Search
CPC ........... H01L 29/0696; H01L 29/66659; H01L 29/7835
See application file for complete search history.

(56) References Cited

U.S. PATENT DOCUMENTS

2012/0273847 A1* 11/2012 Tsai ................ H01L 21/823814
                                                          257/E27.059
2019/0259751 A1*  8/2019 Pala ...................... H01L 29/402
2021/0320203 A1* 10/2021 Li ..................... H01L 21/76224
2022/0028971 A1*  1/2022 Rana .................. H01L 29/1095

OTHER PUBLICATIONS

U.S. PTO Notice of Allowance issued in related U.S. Appl. No. 17/380,682, dated Jul. 26, 2023.
S. Haynie et al., "Power LDMOS with Novel STI Profile for Improved Rsp, BVdss, and Reliability", Proceedings of the 22nd International Symposium on Power Semiconductor Devices & IC's, Hiroshima, Japan, IEEE Electron Devices Society, Jun. 6-10, 2010, pp. 241-244.
Extended European Search Report issued in corresponding European Patent Application No. 22184871.6-1212, dated Dec. 9, 2022.

* cited by examiner

SEMICONDUCTOR DEVICE AND METHOD OF MANUFACTURING THE SAME

CROSS-REFERENCE TO RELATED APPLICATIONS

This is a Continuation of U.S. patent application Ser. No. 17/380,682 filed on Jul. 20, 2021 including the specification, drawings and abstract is incorporated herein by reference in its entirety.

BACKGROUND

The present invention relates to a semiconductor device and a method of manufacturing the same, and particularly to a semiconductor device including a lateral double-diffused MOS (LDMOS) and a method of manufacturing the same.

A semiconductor device including a lateral double-diffused MOS (LDMOS) has been known (see, for example, Non-Patent Document 1). The semiconductor device described in Non-Patent Document 1 has a source region and a drain region formed in a main surface of a semiconductor substrate and a buried insulating film formed in a trench formed between the source region and the drain region. The trench has a first side surface facing the source region, a second side surface facing the drain region, and a bottom surface connecting the first side surface and the second side surface to each other. Non-Patent Document 1 discloses that the on-resistance can be reduced as an inner angle of the trench formed by the first side surface and the bottom surface becomes larger.

THERE ARE DISCLOSED TECHNIQUES LISTED BELOW

[Non-Patent Document 1] S. Haynie et al. "Power LDMOS with Novel STI Profile for Improved Rsp, BVdss, and Reliability" Proceedings of The 22nd International Symposium on Power Semiconductor Devices & ICs, Hiroshima

SUMMARY

The trench in the conventional semiconductor device described above is formed by, for example, the dry etching method. Therefore, the above-mentioned inner angle of the trench formed by the first side surface and the bottom surface varies depending on conditions such as the trench size and the pattern density. As a result, the characteristics of the semiconductor device also vary. Namely, there is room for improvement in the conventional semiconductor device from the viewpoint of improving the characteristics of the semiconductor device.

An object of an embodiment is to improve the characteristics of the semiconductor device. Other objects and novel features will be apparent from the description of this specification and drawings.

A semiconductor device according to an embodiment includes: a source region formed in a main surface of a semiconductor substrate; a drain region separated from the source region and formed in the main surface of the semiconductor substrate; a buried insulating film buried in a first trench formed between the source region and the drain region in the main surface of the semiconductor substrate in a plan view; a gate insulating film formed on a portion of the main surface of the semiconductor substrate located between the source region and the drain region; and a gate electrode formed on the gate insulating film such that one end portion thereof is located on the buried insulating film. The first trench has a first side surface facing the source region in a first direction extending from one of the source region and the drain region to the other and a first bottom surface which is connected to the first side surface and is along the main surface of the semiconductor substrate. A crystal plane of a first surface of the semiconductor substrate, which is the first side surface of the first trench, is a (111) plane. A crystal plane of a second surface of the semiconductor substrate, which is the bottom surface of the first trench, is a (100) plane.

A method of manufacturing a semiconductor device according to an embodiment includes: a step of forming a first trench in a main surface of a semiconductor substrate by a wet etching method; a step of forming a buried insulating film in the main surface of the semiconductor substrate by filling the first trench with an insulating film; step of forming a gate electrode on the main surface of the semiconductor substrate via a gate insulating film such that one end portion of the gate electrode is located on the buried insulating film; and a step of forming a source region and a drain region, which are separated from each other, in the main surface of the semiconductor substrate by an ion implantation method. The first trench has a first side surface facing the source region in a first direction extending from one of the source region and the drain region to the other and a first bottom surface which is connected to the first side surface and is along the main surface of the semiconductor substrate. A crystal plane of a first surface of the semiconductor substrate, which is the first side surface of the first trench, is a (111) plane. A crystal plane of a second surface of the semiconductor substrate, which is the bottom surface of the first trench, is a (100) plane.

According to an embodiment, it is possible to improve the characteristics of the semiconductor device.

DETAILED DESCRIPTION

Figure 1:
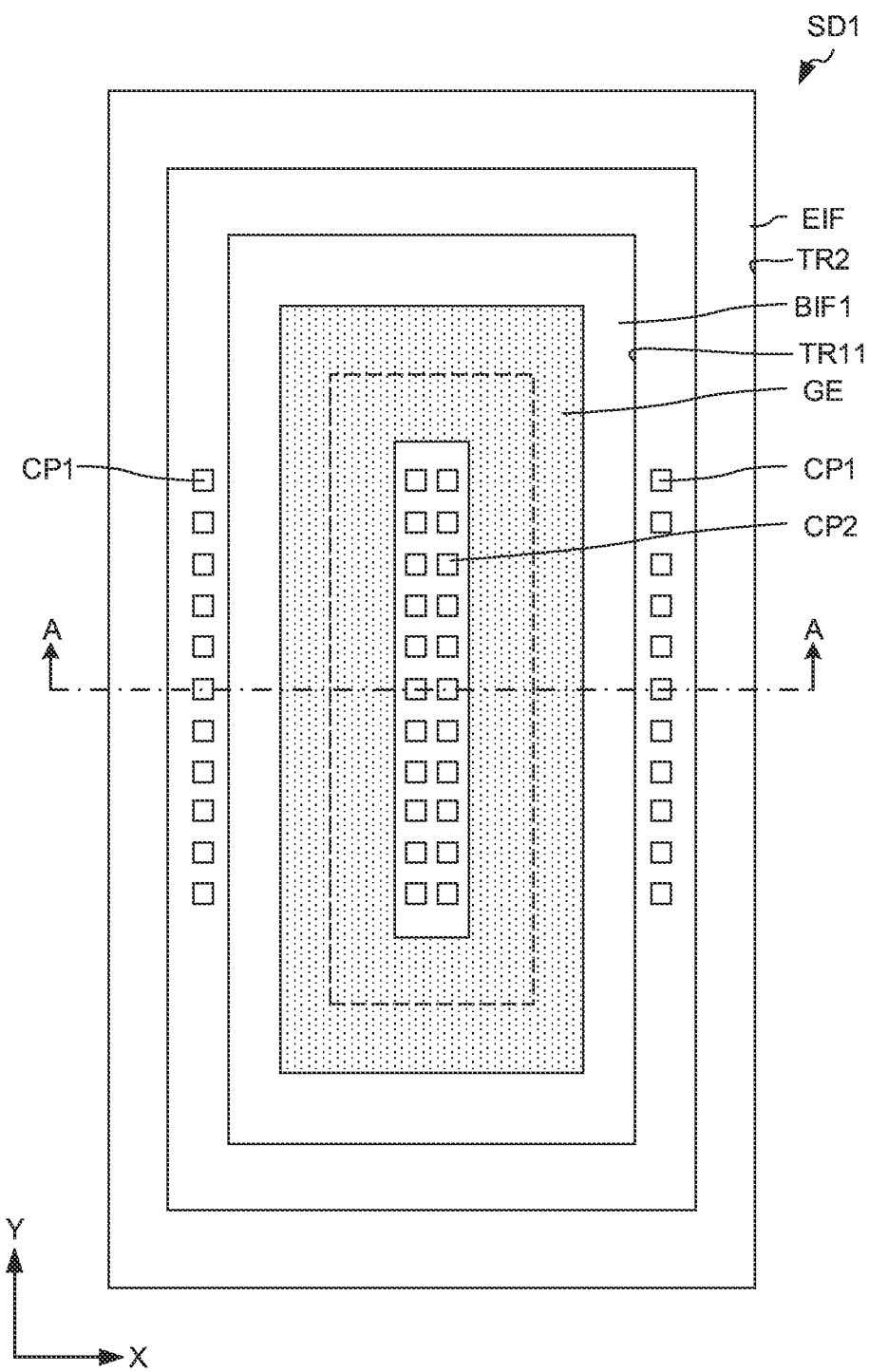
FIG. 1 is a plan view showing an example of a configuration of a main part of a semiconductor device according to the first embodiment.

Hereinafter, semiconductor devices according to embodiments will be described in detail with reference to drawings. Note that, in the specification and the drawings, the same components or corresponding components are denoted by the same reference characters or hatchings and the redundant descriptions thereof are omitted. Also, in the drawings, the configuration may be omitted or simplified in some cases for the convenience of description. The hatching is added in some cases even in a plan view. The cross-sectional view may be shown as an end view in some cases. At least a part of the embodiments and modifications may be combined as appropriate.

First Embodiment

Figure 2:
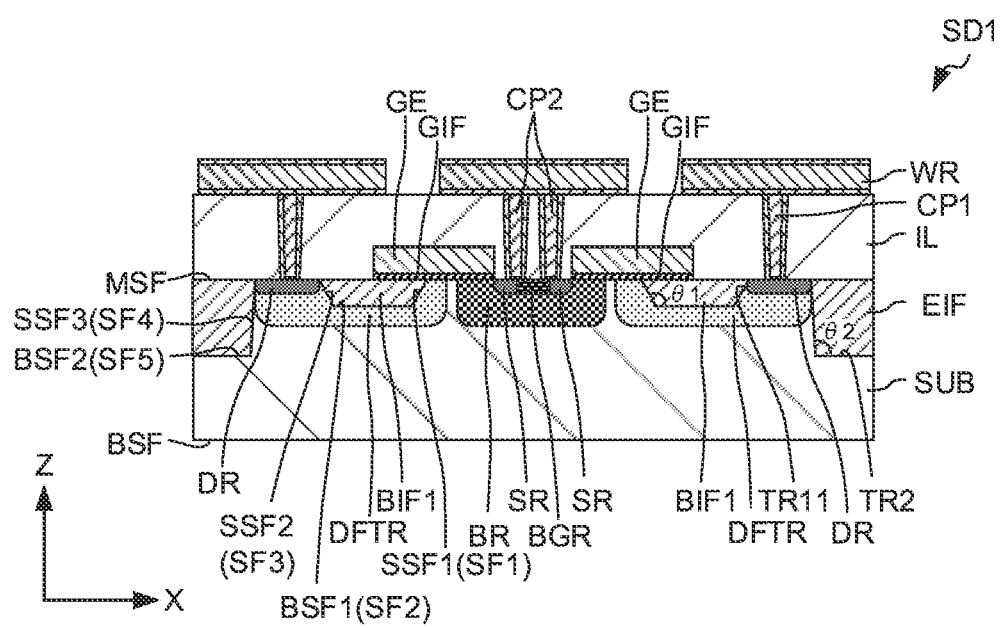
FIG. 2 is a cross-sectional view showing an example of the configuration of the main part of the semiconductor device according to the first embodiment.

FIG. 1 is a plan view showing an example of a configuration of a main part of a semiconductor device SD1 according to the first embodiment. FIG. 2 is a cross-sectional view showing an example of the configuration of the main part of the semiconductor device SD1 according to the first embodiment. FIG. 2 is a cross-sectional view along a line A-A in FIG. 1.

In FIG. 1 and FIG. 2, each of an X direction (first direction) and a Y direction (second direction) is along a main surface of a semiconductor substrate SUB. The X direction is a direction extending from one of a source region SR and a drain region DR to the other. The Y direction is orthogonal to the X direction in a plan view. A Z direction (third direction) is the thickness direction of the semiconductor substrate SUB. The X direction, the Y direction, and the Z direction are orthogonal to each other.

The semiconductor device SD1 includes the semiconductor substrate SUB, a buried insulating film BIF1, an element isolation film EIF, a gate insulating film GIF, a gate electrode GE, an insulating layer IL, a first contact plug CP1, a second contact plug CP2, and a wiring WR.

The semiconductor substrate SUB is, for example, a silicon substrate of a p conductivity type or an n conductivity type. The semiconductor substrate SUB has a main surface MSF and a back surface BSF opposite to the main surface MSF. The main surface MSF of the semiconductor substrate SUB is an element forming surface on which semiconductor elements are formed. The crystal plane of the main surface MSF of the semiconductor substrate SUB is the (100) plane. In this specification, a predetermined crystal plane includes a crystal plane equivalent to the crystal plane. For example, the (100) plane and the (010) plane are equivalent to each other. Note that the "crystal plane" means a crystal lattice plane represented by the Miller index.

A source region SR, a back gate region BGR, a drain region DR, a body region BR, and a drift region DFTR are formed in the semiconductor substrate SUB.

The source region SR is formed in the main surface MSF of the semiconductor substrate SUB. In the first embodiment, the source region SR is formed so as to surround the back gate region BGR in a plan view. The source region SR has a first conductivity type. The first conductivity type is p-type or n-type. The impurity concentration of the source region SR is, for example, $1 \times 10^{17}$ cm$^{-3}$ or more and $1 \times 10^{21}$ cm$^{-3}$ or less.

The back gate region BGR is formed in the main surface MSF of the semiconductor substrate SUB. The back gate region BGR is formed so as to be surrounded by the source region SR in the X direction. The back gate region BGR has a second conductivity type different from the first conductivity type. The second conductive type is p-type or n-type. The impurity concentration of the back gate region BGR is, for example, $1 \times 10^{17}$ cm$^{-3}$ or more and $1 \times 10^{21}$ cm$^{-3}$ or less.

The drain region DR is formed in the main surface MSF of the semiconductor substrate SUB. The drain region DR is separated from the source region SR. The drain region DR has the above-mentioned first conductivity type. The impurity concentration of the drain region DR is, for example, $1 \times 10^{17}$ cm$^{-3}$ or more and $1 \times 10^{21}$ cm$^{-3}$ or less.

The body region BR is formed in the main surface MSF of the semiconductor substrate SUB so as to surround the source region SR and the back gate region BGR. The body region BR is in direct contact with the source region SR and the back gate region BGR. The body region BR has the above-mentioned first conductivity type. The impurity concentration of the body region BR is, for example, $1 \times 10^{14}$ cm$^{-3}$ or more and $1 \times 10^{18}$ cm$^{-3}$ or less.

The drift region DFTR is formed in the main surface MSF of the semiconductor substrate SUB so as to surround at least the drain region DR. The drift region DFTR surrounds the drain region DR and the buried insulating film BIF1. The drift region DFTR is separated from the body region BR. The drift region DFTR is in direct contact with the drain region DR and the buried insulating film BIF1. The drift region DFTR has the above-mentioned second conductivity type. The impurity concentration of the drift region DFTR is, for example, $1 \times 10^{14}$ cm$^{-3}$ or more and $1 \times 10^{18}$ cm$^{-3}$ or less.

A first trench TR11 and a second trench TR2 are formed in the main surface MSF of the semiconductor substrate SUB.

The first trench TR11 is formed between the source region SR and the drain region DR in the main surface MSF of the semiconductor substrate SUB in a plan view. In the first embodiment, the entire first trench TR11 is formed between the source region SR and the drain region DR in a plan view. The first trench TR11 is formed so as to surround the source region SR and the back gate region BGR in a plan view. The first trench TR11 is separated from each of the source region SR, the drain region DR, and the back gate region BGR. The first trench TR11 has a first side surface SSF1, a second side surface SSF2, and a first bottom surface BSF1. The first trench TR11 has a substantially annular shape in a plan view. Alternatively, the first trench TR11 may have a linear shape along the Y direction in a plan view.

The first side surface SSF1 faces the source region SR in the X direction. The first side surface SSF1 faces the source region SR via a part of the semiconductor substrate SUB. The crystal plane of the first surface SF1 of the semiconductor substrate SUB, which is the first side surface SSF1 of the first trench TR11, is the (111) plane. The crystal plane of the entire first surface SF1 is the (111) plane.

The first bottom surface BSF1 is connected to each of the first side surface SSF1 and the second side surface SSF2. The first bottom surface BSF1 is along the main surface MSF of the semiconductor substrate SUB. The entire first bottom surface BSF1 is along the main surface MSF of the semiconductor substrate SUB. The crystal plane of the second surface SF2 of the semiconductor substrate SUB, which is the first bottom surface BSF1 of the first trench TR11, is the (100) plane. The crystal plane of the entire second surface SF2 of the semiconductor substrate SUB is the (100) plane. The crystal plane of the second surface SF2 of the semiconductor substrate SUB is the same as the crystal plane of the main surface MSF of the semiconductor substrate SUB.

The second side surface SSF2 faces the drain region DR in the X direction. The second side surface SSF2 is in direct contact with the drain region DR. The second side surface SSF2 is located on the opposite side of the first side surface SSF1 in the X direction. The crystal plane of a third surface SF3 of the semiconductor substrate SUB, which is the second side surface SSF2 of the first trench TR11, is the (111) plane. The crystal plane of the entire third surface SF3 is the (111) plane.

The second trench TR2 is formed so as to surround the first trench TR11 in the main surface MSF of the semiconductor substrate SUB. The second trench TR2 is separated from the first trench TR11. The second trench TR2 surrounds the source region SR, the drain region DR, and the gate electrode GE in a plan view. The second trench TR2 has a third side surface SSF3 and a second bottom surface BSF2.

The third side surface SSF3 faces the source region SR or the drain region DR in the X direction. In the first embodiment, the third side surface SSF3 faces the drain region DR in the X direction. The third side surface SSF3 is in direct contact with the drain region DR. The crystal plane of a fourth surface SF4 of the semiconductor substrate SUB, which is the third side surface SSF3 of the second trench TR2, is not particularly limited. The fourth surface SF4 may or may not have a specific crystal plane. The fourth surface SF4 may have, for example, a crystal plane of the (111) plane.

The crystal plane of the fourth plane SF4 may be the same as or different from the crystal plane of the first surface SF1 and the crystal plane of the third surface SF3. In the first embodiment, the fourth surface SF4 does not have a specific crystal plane.

The second bottom surface BSF2 is connected to the third side surface SSF3. The second bottom surface BSF2 is along the main surface MSF of the semiconductor substrate SUB. The entire second bottom surface BSF2 is along the main surface MSF of the semiconductor substrate SUB.

A first inner angle $\theta 1$ of the first trench TR11 formed by the first bottom surface BSF1 and the first side surface SSF1 is larger than a second inner angle $\theta 2$ of the second trench TR2 formed by the second bottom surface BSF2 and the third side surface SSF3 ($\theta 1 > \theta 2$). This is preferable from the viewpoint of improving the element isolation characteristics by the element isolation film EIF while reducing the on-resistance between the source region SR and the drain region DR.

The buried insulating film BIF1 is buried in the first trench TR11. The buried insulating film BIF1 is formed in the main surface MSF of the semiconductor substrate SUB. The thickness of the buried insulating film BIF1 is not particularly limited as long as the desired withstand voltage and on-resistance can be achieved at the same time. The material of the buried insulating film BIF1 is, for example, silicon oxide.

The element isolation film EIF is buried in the second trench TR2. The element isolation film EIF is formed in the main surface MSF of the semiconductor substrate SUB. The thickness of the element isolation film EIF is not particularly limited as long as the desired element isolation characteristics can be achieved. The thickness of the element isolation film EIF is preferably larger than the thickness of the buried insulating film BIF1. Consequently, the element isolation characteristics can be improved while achieving the desired withstand voltage and on-resistance. The material of the element isolation film EIF is, for example, silicon oxide.

The gate insulating film GIF is formed on a portion of the main surface MSF of the semiconductor substrate SUB located between the source region SR and the drain region DR that are separated from each other. The gate insulating film GIF is adjacent to the buried insulating film BIF1. The thickness of the gate insulating film GIF is, for example, 2 nm or more and 100 nm or less. The material of the gate insulating film GIF is, for example, silicon oxide.

The gate electrode GE is formed on the gate insulating film GIF. The gate electrode GE is formed on the main surface MSF of the semiconductor substrate SUB via the gate insulating film GIF. As shown in FIG. 2, one end portion of the gate electrode GE is located on the buried insulating film BIF1. The material of the gate electrode GE is, for example, conductive polycrystalline silicon.

The insulating layer IL is formed on the main surface MSF of the semiconductor substrate SUB so as to cover the gate electrode GE. The thickness of the insulating layer IL is, for example, 50 nm or more and 1 μm or less. The material of the insulating layer IL is, for example, silicon oxide.

The first contact plug CP1 is formed in the insulating layer IL so as to reach the drain region DR. As the first contact plug CP1, a known configuration adopted as a contact plug (via) in the semiconductor technology can be adopted. The first contact plug CP1 has, for example, a barrier film and a conductive film formed on the barrier film. Examples of the material of the barrier film include titanium (Ti), titanium nitride (TiN), tantalum (Ta), and tantalum nitride (TaN). The material of the conductive film is, for example, tungsten (W), aluminum (Al), or copper (Cu).

The second contact plug CP2 is formed in the insulating layer IL so as to reach each of the source region SR and the back gate region BGR. A part of the second contact plug CP2 reaches the source region SR. The other part of the second contact plug CP2 reaches the back gate region BGR. The configuration example of the second contact plug CP2 is the same as that of the first contact plug CP1.

The wiring WR is formed on the insulating layer IL. The wiring WR is in contact with the first contact plug CP1 or the second contact plug CP2. As the wiring WR, a known configuration adopted as a wiring in the semiconductor technology can be adopted. The wiring WR is, for example, a stacked film in which a barrier metal, a conductive film, and a barrier metal are stacked in this order. Examples of the material constituting the barrier metal include titanium (Ti), titanium nitride (TiN), tantalum (Ta), and tantalum nitride (TaN). Examples of the material constituting the conductive film include aluminum, copper, and tungsten.

(Method of Manufacturing Semiconductor Device)

Next, an example of the method of manufacturing the semiconductor device SD1 according to the first embodiment will be described. FIG. 3 to FIG. 9 are cross-sectional views showing an example of the steps included in the method of manufacturing the semiconductor device SD1.

The method of manufacturing the semiconductor device SD1 includes, for example, (1) a step of preparing the semiconductor substrate SUB, (2) a step of forming the second trench TR2, (3) a step of forming the first trench TR11, (4) a step of forming the buried insulating film BIF1 and the element isolation film EIF, (5) a step of forming the gate insulating film GIF and the gate electrode GE, (6) a step of forming the source region SR, the drain region DR, and the back gate region BGR, and (7) a step of forming the insulating layer IL, the first contact plug CP1, the second contact plug CP2, and the wiring WR.

(1) Preparation of Semiconductor Substrate SUB

Figure 3:
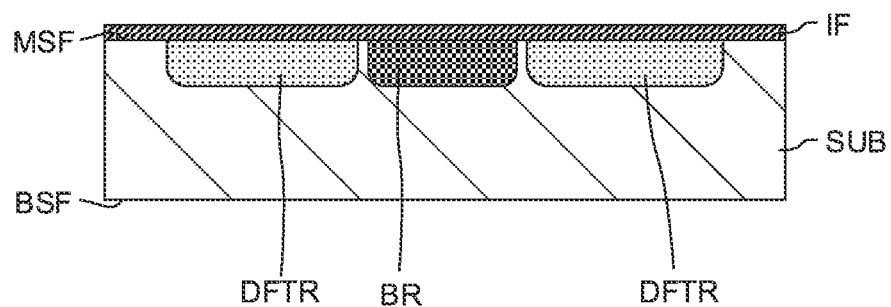
FIG. 3 is a cross-sectional view showing an example of a step included in a method of manufacturing a semiconductor device according to the first embodiment.

First, as shown in FIG. 3, the semiconductor substrate SUB is prepared. The semiconductor substrate SUB may be purchased as a commercially available product or fabricated. In the first embodiment, the body region BR and the drift region DFTR are formed in the semiconductor substrate SUB. An insulating film IF is formed on the main surface MSF of the semiconductor substrate SUB. The insulating film IF is, for example, a stacked film of a silicon oxide film and a silicon nitride film formed on the silicon oxide film. The method of forming the body region BR and the drift region DFTR is, for example, an ion implantation method. The method of forming the insulating film IF is, for example, the thermal oxidation method or the CVD method.

(2) Formation of Second Trench TR2

Figure 4:
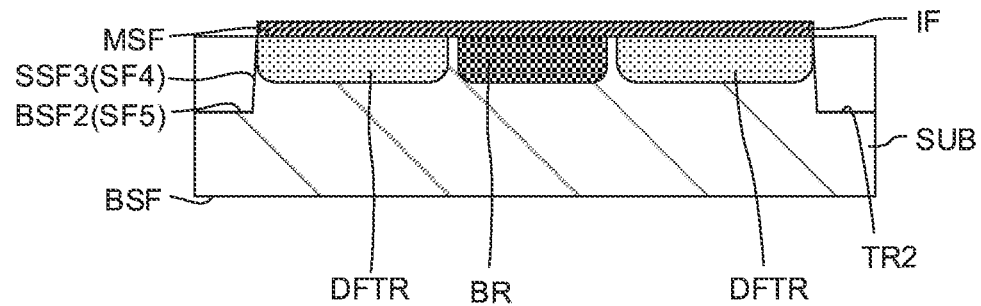
FIG. 4 is a cross-sectional view showing an example of a step included in the method of manufacturing the semiconductor device according to the first embodiment.

Next, as shown in FIG. 4, the second trench TR2 is formed in the main surface MSF of the semiconductor substrate SUB. At this time, the insulating film IF may be used as an etching mask. The second trench TR2 is formed so as to surround the region in which the source region SR, the drain region DR, and the gate electrode GE are formed in a plan view. The method of forming the second trench TR2 is, for example, the dry etching method or the wet etching method. The method of forming the second trench TR2 is preferably the dry etching method. Consequently, the second inner angle θ2 of the second trench TR2 (see FIG. 2) can be made smaller than the first inner angle θ1 of the first trench TR11. When the second trench TR2 is formed by the wet etching method, an example of the etching solution is the same as the etching solution for forming the first trench TR11.

(3) Formation of First Trench TR11

Figure 5:
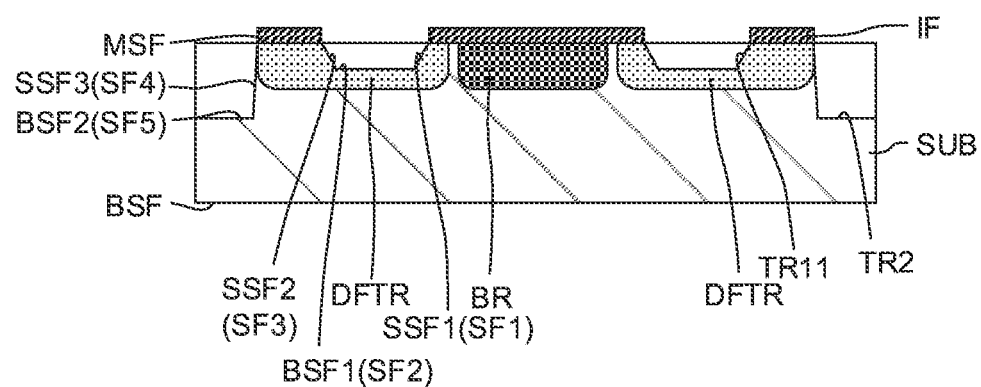
FIG. 5 is a cross-sectional view showing an example of a step included in the method of manufacturing the semiconductor device according to the first embodiment.

Next, as shown in FIG. 5, the first trench TR11 is formed in the first surface SF1 of the semiconductor substrate SUB. At this time, the insulating film IF may be used as an etching mask. The method of forming the first trench TR11 is a wet etching method. The etching rate varies depending on the crystal orientation of the semiconductor substrate SUB. Therefore, the surface of the semiconductor substrate SUB forming the inner surface of the first trench TR11 is composed of the crystal plane having the lowest etching rate. In the first embodiment, the crystal plane of the first surface SF1 of the semiconductor substrate SUB corresponding to the first side surface SSF1 of the first trench TR11 is the (111) plane. The crystal plane of the third surface SF3 of the semiconductor substrate SUB corresponding to the second side surface SSF2 of the first trench TR11 is the (111) plane. The crystal plane of the second surface SF2 of the semiconductor substrate SUB corresponding to the first bottom surface BSF1 of the first trench TR11 is the (100) plane. In this case, the first inner angle θ1 of the first trench TR11 is 125 degrees or more and 130 degrees or less. Consequently, it can be presumed that the first trench TR11 is formed by the wet etching method.

The etching solution for forming the first trench TR11 is, for example, potassium hydroxide (KOH) aqueous solution, tetramethylammonium hydroxide (TMAH) aqueous solution, ethylenediamine-pyrocatechol (EDP) aqueous solution, hydrazine ($N_2H_4$) aqueous solution, sodium hydroxide aqueous solution, or cesium hydroxide (CsOH) aqueous solution.

(4) Formation of Buried Insulating Film BIF1 and Element Isolation Film EIF

Figure 6:
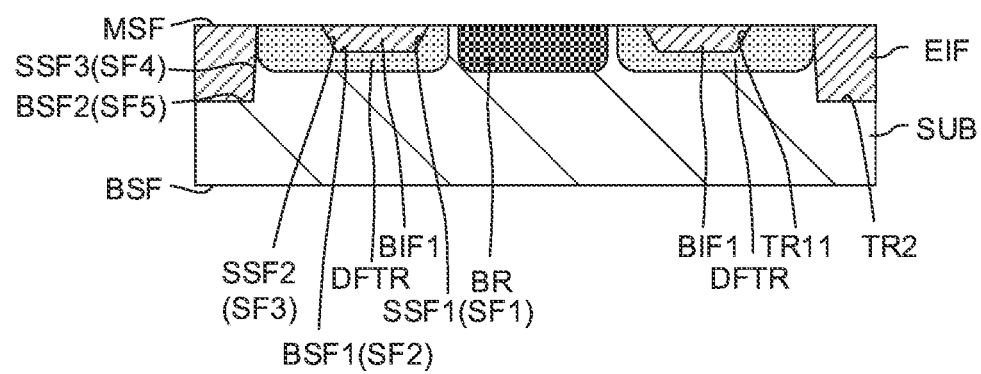
FIG. 6 is a cross-sectional view showing an example of a step included in the method of manufacturing the semiconductor device according to the first embodiment.

Next, as shown in FIG. 6, the buried insulating film BIF and the element isolation film EIF are formed. Specifically, an insulating film is buried in the first trench TR11 and the second trench TR2. The method of forming the insulating film is, for example, the CVD method. A surplus part of the insulating film formed outside the first trench TR11 and the second trench TR2 and the insulating film IF are removed by, for example, the CMP method.

(5) Formation of Gate Insulating Film GIF and Gate Electrode GE

Figure 7:
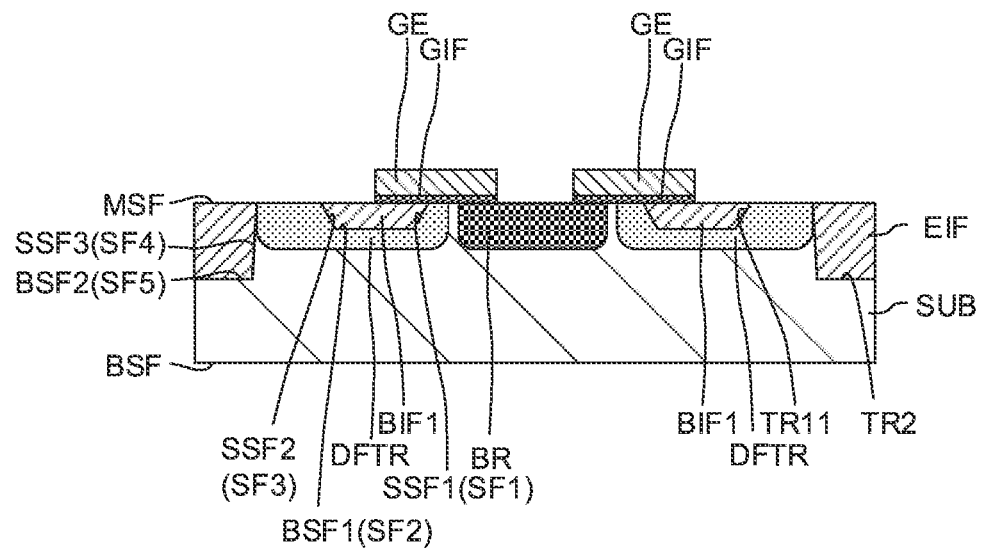
FIG. 7 is a cross-sectional view showing an example of a step included in the method of manufacturing the semiconductor device according to the first embodiment.

Next, as shown in FIG. 7, the gate insulating film GIF and the gate electrode GE are formed on the main surface MSF of the semiconductor substrate SUB. The gate electrode GE is formed on the gate insulating film GIF. The gate electrode GE is formed such that one end portion of the gate electrode GE is located on the buried insulating film BIF1. The gate electrode GE is formed on the main surface MSF of the semiconductor substrate SUB via the gate insulating film GIF. Specifically, a stacked film of an insulating film for the gate insulating film GIF and a conductive film for the gate electrode GE is formed on the main surface MSF of the semiconductor substrate SUB. Then, the stacked film is patterned into a desired shape. The method of forming the insulating film is, for example, the thermal oxidation method or the CVD method. The method of forming the conductive film is, for example, the CVD method. The patterning method of the stacked film is, for example, the photolithography method and the dry etching method.

(6) Formation of Source Region SR, Drain Region DR, and Back Gate Region BGR

Figure 8:
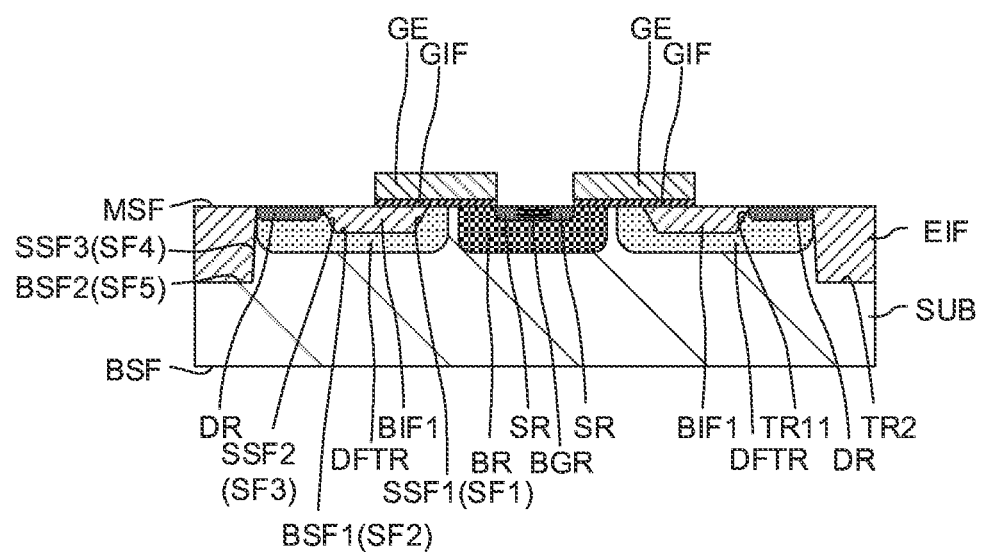
FIG. 8 is a cross-sectional view showing an example of a step included in the method of manufacturing the semiconductor device according to the first embodiment.

Next, as shown in FIG. 8, the source region SR, the drain region DR, and the back gate region BGR are formed in the main surface MSF of the semiconductor substrate SUB. The source region SR is formed so as to be adjacent to the gate electrode GE in a plan view. The drain region DR is formed so as to be adjacent to the buried insulating film BIF1 in a plan view. The method of forming the source region SR, the drain region DR, and the back gate region BGR is, for example, the ion implantation method.

Figure 9:
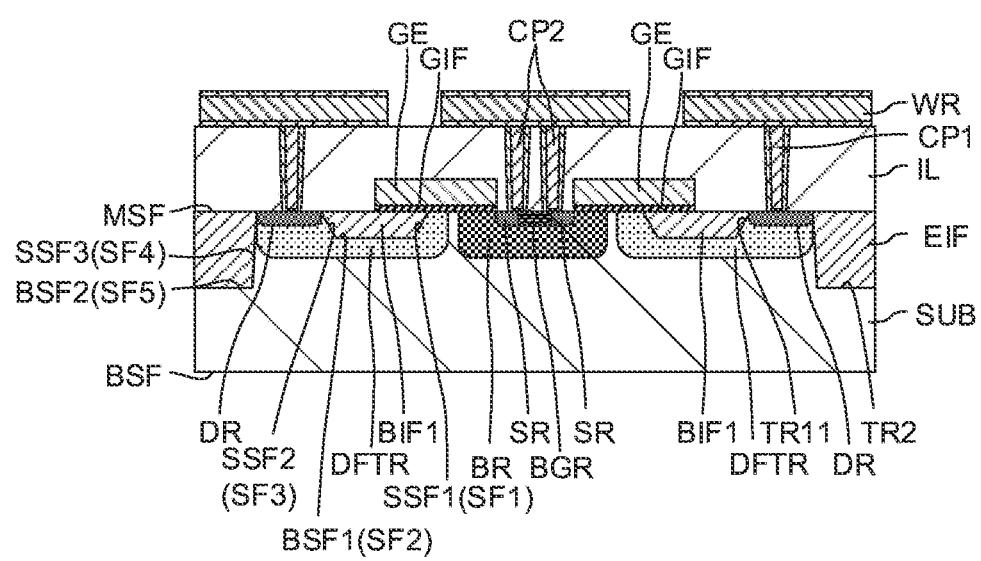
FIG. 9 is a cross-sectional view showing an example of a step included in the method of manufacturing the semiconductor device according to the first embodiment.

(7) Formation of Insulating Layer IL, First Contact Plug CP1, Second Contact Plug CP2, and Wiring WR Next, as shown in FIG. 9, a wiring layer including the insulating layer IL, the first contact plug CP1, the second contact plug CP2, and the wiring WR is formed on the semiconductor substrate SUB. As the method of forming the wiring layer, a known method as the method of forming the multilayer wiring layer in the semiconductor technology can be adopted.

The method of forming the insulating layer IL is, for example, the CVD method. The first contact plug CP1 and the second contact plug CP2 are formed by forming through holes in the insulating layer IL and then filling the through holes with a conductive material. The wiring WR is formed by forming a conductive film on the insulating layer IL by the sputtering method and then patterning the conductive film into a desired shape.

By the manufacturing method above, the semiconductor device SD1 according to the first embodiment can be manufactured.

(Effect)

In the semiconductor device SD1 according to the first embodiment, the crystal plane of the first surface SF1 of the semiconductor substrate SUB, which is the first side surface SSF1 of the first trench TR11, is the (111) plane. The crystal plane of the second surface SF2 of the semiconductor substrate SUB, which is the first bottom surface BSF1 of the first trench TR11, is the (100) plane. The first trench TR11 is formed by the wet etching method. Since the etching rate differs depending on the crystal lattice plane, the first trench TR11 is composed of the surface of the semiconductor substrate SUB having a predetermined crystal lattice plane. Since the shape of the first trench TR11 is defined by the crystal lattice plane of the semiconductor substrate SUB, the shape of the first trench TR11 is hard to fluctuate depending on the size of the trench TR11 and the pattern density as compared with the case where the first trench TR11 is formed by the dry etching method. Further, the first side surface SSF1 facing the source region SR in the X direction becomes a gentler inclined surface as compared with the case where the first trench TR11 is formed by the dry etching method. Accordingly, the impact ionization that occurs at the corner portion of the first trench TR11 located near the intersection of the first surface SF1 and the second surface SF2 can be alleviated. Consequently, the on-resistance between the source region SR and the drain region DR can be reduced. As a result, the characteristics of the semiconductor device SD1 can be improved.

Second Embodiment

A semiconductor device SD2 according to the second embodiment is different from the semiconductor device SD1 according to the first embodiment mainly in the shape of a first trench TR12, the shape of a buried insulating film BIF2, and the positions of the components. Thus, in the following, the same components as those of the semiconductor device SD1 according to the first embodiment are denoted with the same reference characters, and the descriptions thereof are omitted.

Figure 10:
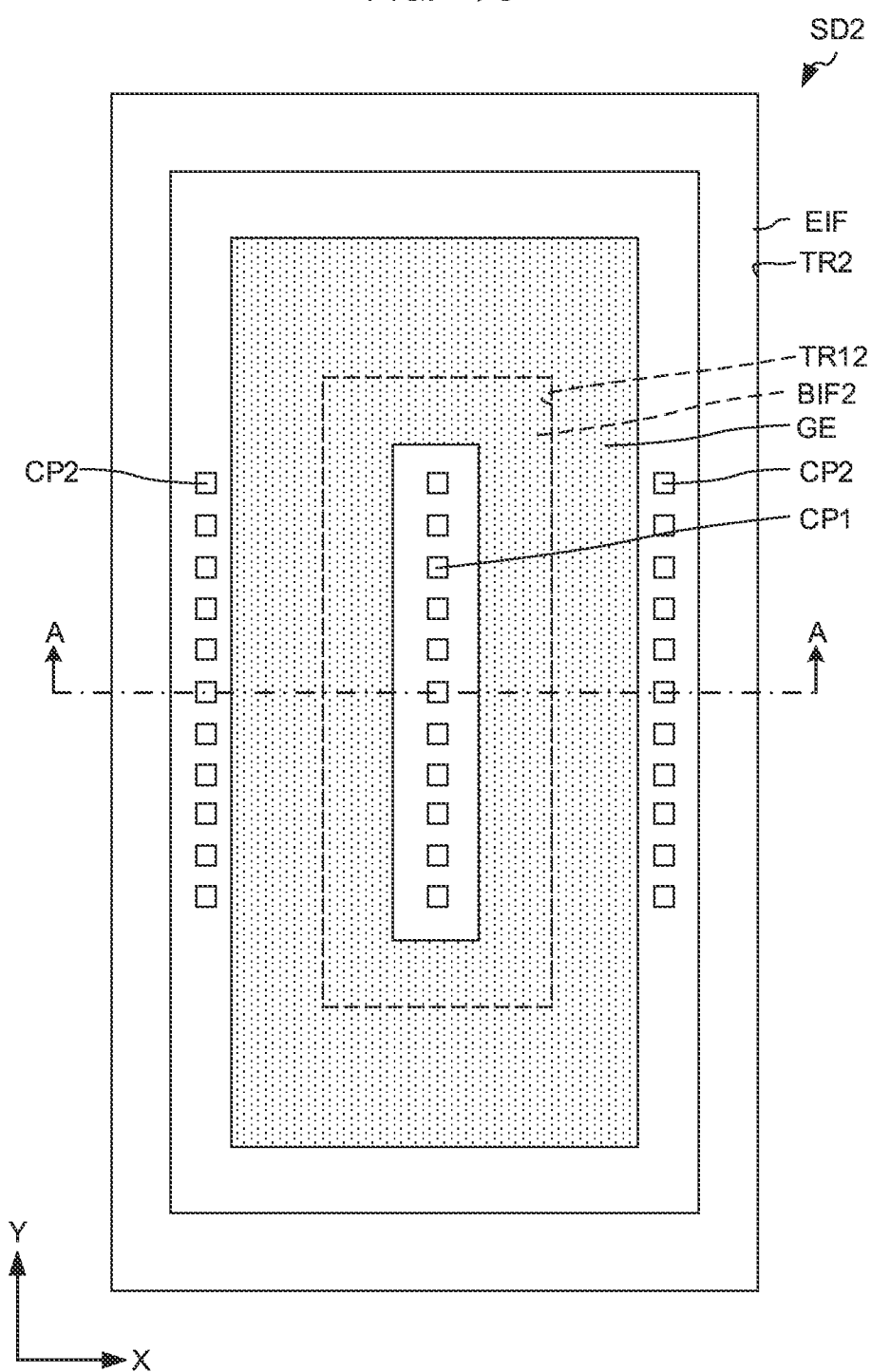
FIG. 10 is a plan view showing an example of a configuration of a main part of a semiconductor device according to the second embodiment.
Figure 11:
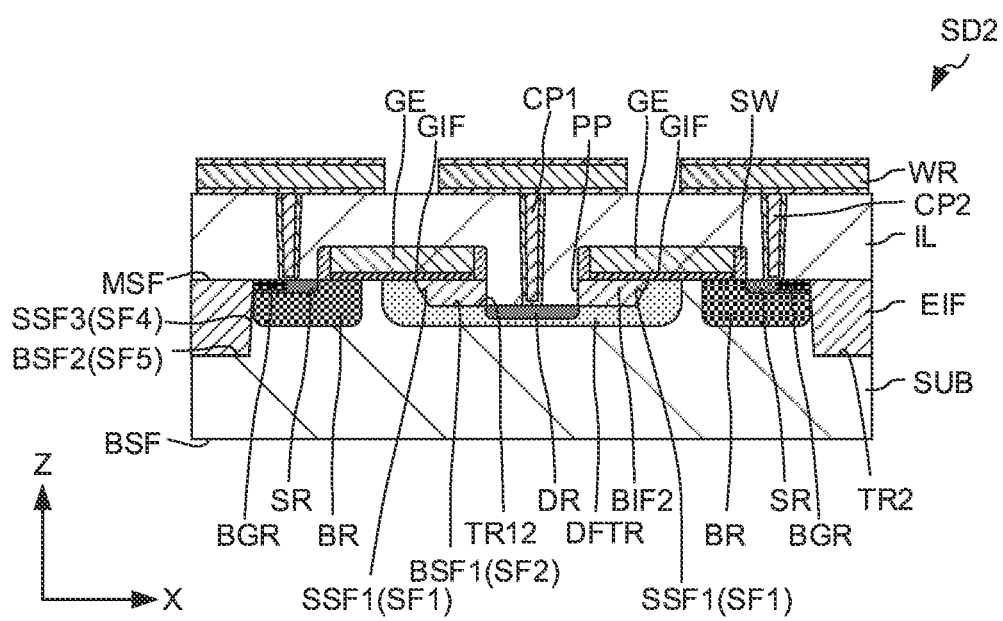
FIG. 11 is a cross-sectional view showing an example of the configuration of the main part of the semiconductor device according to the second embodiment.

FIG. 10 is a plan view showing an example of a configuration of a main part of the semiconductor device SD2 according to the second embodiment. FIG. 11 is a cross-sectional view showing an example of the configuration of the main part of the semiconductor device SD2. FIG. 11 is a cross-sectional view along a line A-A in FIG. 10.

The semiconductor device SD2 includes the semiconductor substrate SUB, the buried insulating film BIF2, the element isolation film EIF, the gate insulating film GIF, the gate electrode GE, a sidewall insulating film SW, the insulating layer IL, the first contact plug CP1, the second contact plug CP2, and the wiring WR.

The source region SR, the back gate region BGR, the drain region DR, the body region BR, and the drift region DFTR are formed in the semiconductor substrate SUB. In the second embodiment, the positions of the respective regions are different from those of the regions in the first embodiment.

The source region SR is formed in the main surface MSF of the semiconductor substrate SUB. The source region SR is in contact with the element isolation film EIF via the back gate region BGR. In the second embodiment, the source region SR is formed so as to be surrounded by the back gate region BGR in a plan view.

The back gate region BGR is formed in the main surface MSF of the semiconductor substrate SUB. The back gate region BGR is formed so as to be sandwiched between the source region SR and the element isolation film EIF in the X direction.

The drain region DR is formed in the main surface MSF of the semiconductor substrate SUB. The drain region DR is separated from the source region SR. The drain region DR is formed such that the upper surface of the drain region DR is exposed from the buried insulating film BIF2 in a plan view.

The body region BR is formed in the main surface MSF of the semiconductor substrate SUB so as to surround the source region SR and the back gate region BGR. The body region BR is in direct contact with the source region SR, the back gate region BGR, and the element isolation film EIF.

The drift region DFTR is formed in the main surface MSF of the semiconductor substrate SUB so as to surround at least the drain region DR. The drift region DFTR surrounds the drain region DR and the buried insulating film BIF2. The drift region DFTR is separated from the body region BR. The drift region DFTR is in direct contact with the drain region DR.

The first trench TR12 and the trench TR2 are formed in the main surface of the semiconductor substrate SUB.

The first trench TR12 is formed between the source region SR and the drain region DR in the main surface MSF of the semiconductor substrate SUB in a plan view. A part of the first trench TR12 is formed between the source region SR and the drain region DR in a plan view. Another part of the first trench TR12 overlaps the drain region DR. The first trench TR12 is formed so as to be surrounded by the source region SR in a plan view. The first trench TR12 is separated from the source region SR. The first trench TR12 has the first side surface SSF1 and the first bottom surface BSF1. In the second embodiment, the first trench TR12 does not have the second side surface SSF2. The first trench TR12 has a substantially rectangular shape in a plan view. A part of the first bottom surface BSF1 is the upper surface of the drain region DR.

The third side surface SSF3 of the second trench TR2 faces the source region SR or the drain region DR in the X direction. In the second embodiment, the third side surface SSF3 faces the source region SR via the back gate region BGR in the X direction. The third side surface SSF3 is in indirect contact with the source region SR via the back gate region BGR.

The buried insulating film BIF2 is buried in the first trench TR12. In the second embodiment, the buried insulating film BIF2 is buried in a part of the first trench TR12 such that the drain region DR is exposed from the buried insulating film BIF2 in a plan view. The buried insulating film BIF2 is formed in the main surface MSF of the semiconductor substrate SUB. The thickness of the buried insulating film BIF2 is not particularly limited as long as the desired withstand voltage and on-resistance can be achieved at the same time. The material of the buried insulating film BIF2 is, for example, silicon oxide.

A penetrating portion PP reaching the drain region DR is formed in the buried insulating film BIF2. An inner surface of the penetrating portion PP is formed continuously with a side surface of the sidewall insulating film SW. Consequently, the penetrating portion PP can be formed with using the sidewall insulating film SW as an etching mask. Therefore, the manufacturing process of the semiconductor device SD2 can be simplified.

The sidewall insulating film SW is formed on the main surface MSF of the semiconductor substrate SUB so as to be in direct contact with the side surface of the gate electrode GE. The material of the sidewall insulating film SW is, for example, silicon oxide.

The insulating layer IL is formed on the main surface MSF of the semiconductor substrate SUB so as to cover the gate electrode GE. A part of the insulating layer IL is buried in the penetrating portion PP.

A part (lower part) of the first contact plug CP1 is formed in the penetrating portion PP. The above-mentioned part of the first contact plug CP1 is in direct or indirect contact with the inner surface of the buried insulating film BIF2. In the second embodiment, the above-mentioned part of the first contact plug CP1 is in contact with the inner surface of the buried insulating film BIF2 via the above-mentioned part of the insulating layer IL. In the penetrating portion PP, the above-mentioned part of the insulating layer IL is formed between the first contact plug CP1 and the buried insulating film BIF2. The fact that the above-mentioned part of the first contact plug CP1 is in contact with the inner surface of the buried insulating film BIF2 via the above-mentioned part of the insulating layer IL is preferable from the viewpoint that the parasitic capacitance between the drain region DR and the gate electrode GE can be further reduced when the material of the insulating layer IL is a low dielectric constant film.

(Method of Manufacturing Semiconductor Device)

Next, an example of the method of manufacturing the semiconductor device SD2 according to the second embodiment will be described. FIG. 12 to FIG. 19 are cross-sectional views showing an example of the steps included in the method of manufacturing the semiconductor device SD2.

The method of manufacturing the semiconductor device SD2 includes, for example, (1) a step of preparing the semiconductor substrate SUB, (2) a step of forming the second trench TR2, (3) a step of forming the first trench TR12, (4) a step of forming the buried insulating film BIF2 and the element isolation film EIF, (5) a step of forming the gate insulating film GIF, the gate electrode GE, and the sidewall insulating film SW, (6) a step of forming the penetrating portion PP, (7) a step of forming the source region SR, the drain region DR, and the back gate region BGR, and (8) a step of forming the insulating layer IL, the first contact plug CP1, the second contact plug CP2, and the wiring WR.

(1) Preparation of Semiconductor Substrate SUB

Figure 12:
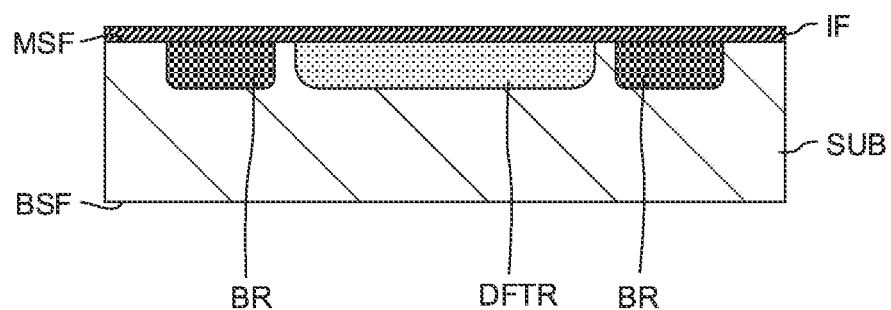
FIG. 12 is a cross-sectional view showing an example of a step included in a method of manufacturing a semiconductor device according to the second embodiment.

First, as shown in FIG. 12, the semiconductor substrate SUB is prepared. The method of preparing the semiconductor substrate SUB is the same as (1) a step of preparing the semiconductor substrate SUB in the first embodiment.

(2) Formation of Second Trench TR2

Figure 13:
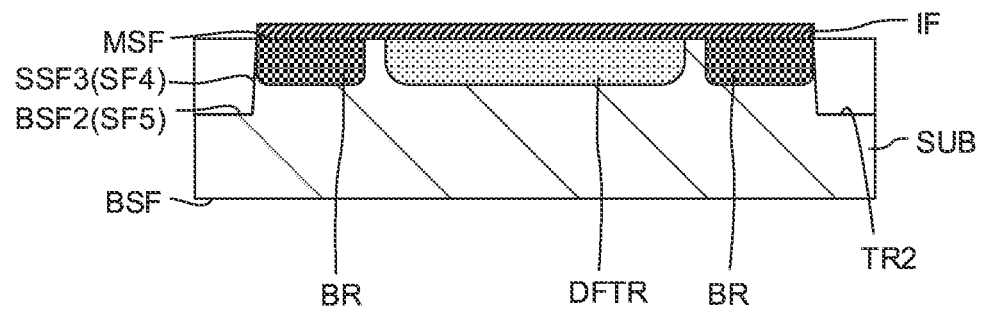
FIG. 13 is a cross-sectional view showing an example of a step included in the method of manufacturing the semiconductor device according to the second embodiment.

Next, as shown in FIG. 13, the second trench TR2 is formed in the main surface MSF of the semiconductor substrate SUB. The method of forming the second trench TR2 is the same as (2) a step of forming the second trench TR2 in the first embodiment.

(3) Formation of First Trench TR12

Figure 14:
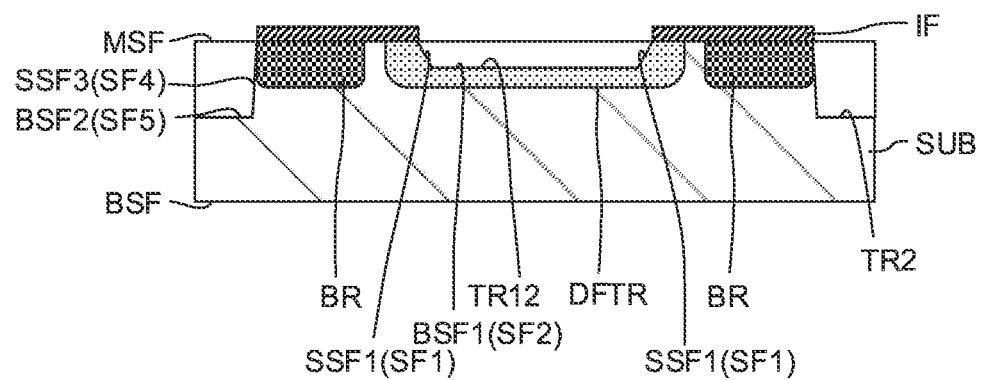
FIG. 14 is a cross-sectional view showing an example of a step included in the method of manufacturing the semiconductor device according to the second embodiment.

Next, as shown in FIG. 14, the first trench TR12 is formed in the main surface MSF of the semiconductor substrate SUB. The method of forming the first trench TR12 is the same as (3) a step of forming the first trench TR12 in the first embodiment except the position and shape of the first trench TR12.

(4) Formation of Buried Insulating Film BIF2 and Element Isolation Film EIF

Figure 15:
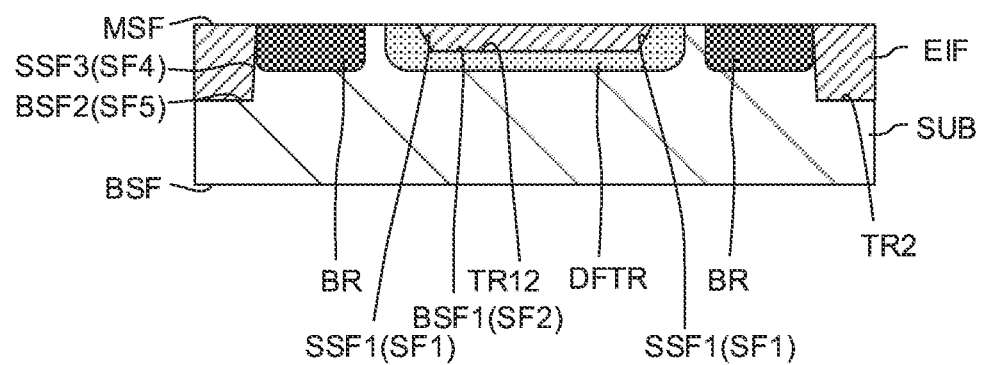
FIG. 15 is a cross-sectional view showing an example of a step included in the method of manufacturing the semiconductor device according to the second embodiment.

Next, as shown in FIG. 15, the buried insulating film BIF2 and the element isolation film EIF are formed. Specifically, an insulating film is buried in the first trench TR12 and the second trench TR2. The method of forming the insulating film is, for example, the CVD method. A surplus part of the insulating film formed outside the first trench TR12 and the second trench TR2 and the insulating film IF are removed by, for example, the CMP method.

Figure 16:
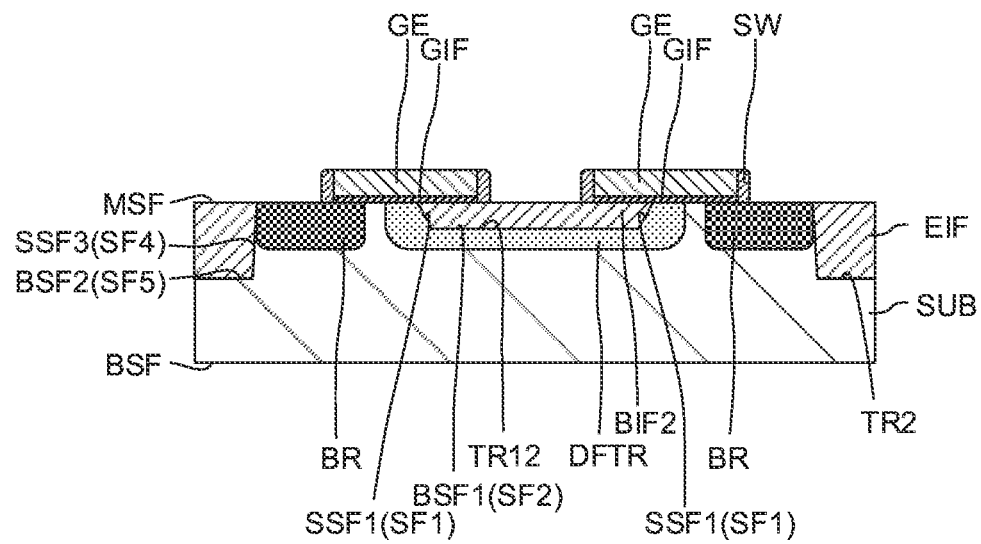
FIG. 16 is a cross-sectional view showing an example of a step included in the method of manufacturing the semiconductor device according to the second embodiment.

(5) Formation of Gate Insulating Film GIF, Gate Electrode GE, and Sidewall Insulating Film SW Next, as shown in FIG. 16, the gate insulating film GIF, the gate electrode GE, and the sidewall insulating film SW are formed on the main surface MSF of the substrate SUB. The method of forming the gate insulating film GIF and the gate electrode GE is the same as (5) a step of forming the gate insulating film GIF and the gate electrode GE in the first embodiment. The sidewall insulating film SW is formed by, for example, forming an insulating film on the semiconductor substrate SUB so as to cover the structure composed of the gate insulating film GIF and the gate electrode GE by the CVD method and then patterning the insulating film by overetching.

(6) Formation of Penetrating Portion PP

Figure 17:
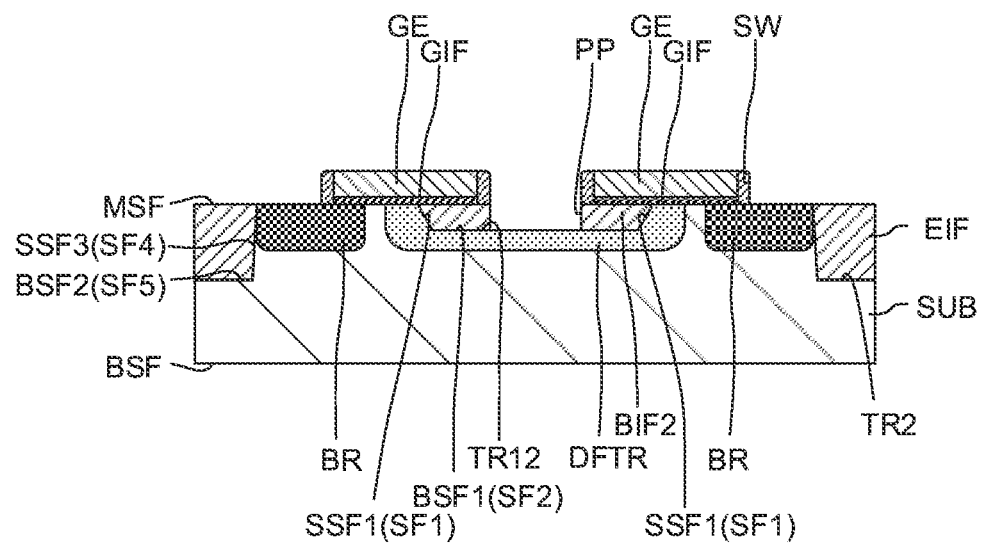
FIG. 17 is a cross-sectional view showing an example of a step included in the method of manufacturing the semiconductor device according to the second embodiment.

Next, as shown in FIG. 17, the penetrating portion PP is formed in a part of the buried insulating film BIF2 exposed from the gate electrode GE and the sidewall insulating film SW. The sidewall insulating film SW may be used as an etching mask. The method of forming the penetrating portion PP is, for example, the dry etching method. The penetrating portion PP may be formed at the same time with the overetching for forming the sidewall insulating film SW.

(7) Formation of Source Region SR, Drain Region DR, and Back Gate Region BGR

Figure 18:
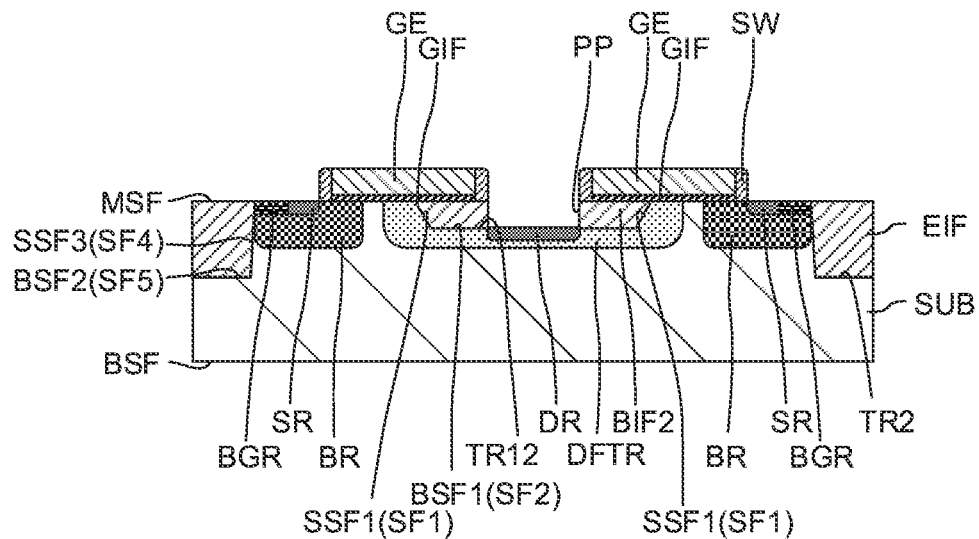
FIG. 18 is a cross-sectional view showing an example of a step included in the method of manufacturing the semiconductor device according to the second embodiment.

Next, as shown in FIG. 18, the source region SR, the drain region DR, and the back gate region BGR are formed in the main surface MSF of the semiconductor substrate SUB. The source region SR is formed so as to be adjacent to the gate electrode GE in a plan view. The drain region DR is formed so as to be adjacent to the buried insulating film BIF2 in a plan view. The method of forming the source region SR, the drain region DR, and the back gate region BGR is, for example, the ion implantation method.

Figure 19:
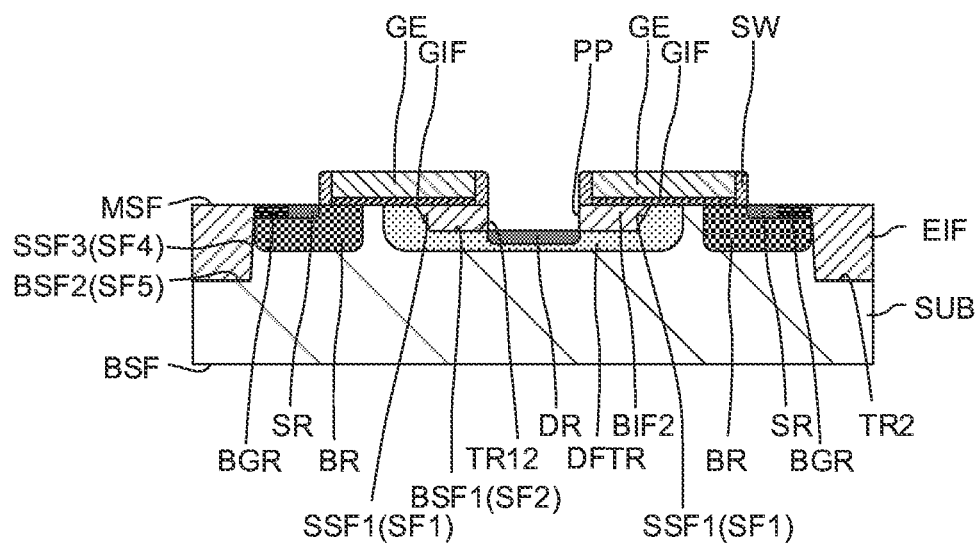
FIG. 19 is a cross-sectional view showing an example of a step included in the method of manufacturing the semiconductor device according to the second embodiment.

(8) Formation of Insulating Layer IL, First Contact Plug CP1, Second Contact Plug CP2, and Wiring WR Next, as shown in FIG. 19, a wiring layer including the insulating layer IL, the first contact plug CP1, the second contact plug CP2, and the wiring WR is formed on the semiconductor substrate SUB. The insulating film IL is formed on the main surface MSF of the semiconductor substrate SUB so as to fill the penetrating portion PP. The method of forming the insulating film IL, the first contact plug CP1, the second contact plug CP2, and the wiring WR is the same as (7) a step of forming the insulating layer IL, the first contact plug CP1, the second contact plug CP2, and the wiring WR in the first embodiment except that a part of the insulating layer IL and a part (lower part) of the first contact plug CP1 are formed so as to be located in the penetrating portion PP.

By the manufacturing method above, the semiconductor device SD2 according to the second embodiment can be manufactured.

(Effect)

The second embodiment can achieve the same effect as the first embodiment. Further, in the semiconductor device SD2 according to the second embodiment, a part of the first bottom surface BSF1 of the first trench TR12 is the upper surface of the drain region DR. Namely, the first trench TR12 does not have the second side surface facing the drain region DR in the X direction. Consequently, the length of the current path between the source region SR and the drain region DR can be shortened as compared with the semiconductor device SD1 according to the first embodiment. As a result, the characteristics of the semiconductor device SD2 can be improved.

The present invention is not limited to the above embodiments, and various modifications can be made without departing from the gist thereof. For example, the semiconductor device SD1 according to the first embodiment may have the side wall insulating film SW according to the second embodiment. Further, the step of forming the first trenches TR11 and TR12 and the step of forming the second trench TR2 may be performed at the same timing. As a result, the manufacturing process can be reduced. In this case, the crystal plane of the fourth surface SF4 of the semiconductor substrate SUB, which is the third side surface SSF3 of the second trench TR2, is the (111) plane. The crystal plane of a fifth surface SF5 of the semiconductor substrate SUB, which is the second bottom surface BSF2 of the second trench TR2, is the (100) plane. The thickness of the first trenches TR11 and TR12 and the thickness of the second trench TR2 are the same as each other.

Also, even when a specific numerical example is presented, a numerical value exceeding the numerical example or a numerical value less than the numerical example is also applicable except the case the value is apparently limited to the numerical example in theory. Also, as to the description about the material, it means "B composed mainly of A" or the like, and it does not intend to exclude the material containing other components.

Further, at least a part of each embodiment and at least a part of each modification may be combined with each other as appropriate.

What is claimed is:

1. A semiconductor device comprising:
a semiconductor substrate having a main surface;
a source region formed in the main surface of the semiconductor substrate;
a drain region formed in the main surface of the semiconductor substrate, the drain region being separated from the source region;
a first trench formed between the source region and the drain region and in the main surface of the semiconductor substrate;
a buried insulating film buried in the first trench;
a gate insulating film formed on a portion of the main surface of the semiconductor substrate, the portion being located between the source region and the drain region;
a gate electrode formed on the gate insulating film such that one end portion of the gate electrode is located on the buried insulating film;
a second trench formed in the main surface of the semiconductor substrate, the second trench surrounding the source region, the drain region and the gate electrode in plan view; and
an element isolation film buried in the second trench,
wherein a thickness of the element isolation film is larger than a thickness of the buried insulating film,
wherein the first trench surrounds the source region in plan view and is separated from the source region, and
wherein the second trench surrounds the first trench in plan view and is separated from the first trench in plan view.

2. The semiconductor device according to claim 1,
wherein the first trench has:
a first side surface facing the source region in a first direction extending from one of the source region and the drain region to the other; and
a first bottom surface which is connected to the first side surface and is along the main surface of the semiconductor substrate,
wherein the second trench has:
a third side surface facing the source region or the drain region in the first direction; and
a second bottom surface which is connected to the third side surface and is along the main surface of the semiconductor substrate, and
wherein a first inner angle of the first trench formed by the first bottom surface and the first side surface is larger than a second inner angle of the second trench formed by the second bottom surface and the third side surface.

3. The semiconductor device according to claim 2,
wherein a crystal plane of a first surface of the semiconductor substrate, which is the first side surface of the first trench, is a (111) plane,
wherein a crystal plane of a second surface of the semiconductor substrate, which is the bottom surface of the first trench, is a (100) plane.

4. The semiconductor device according to claim 3,
wherein the first trench further has a second side surface facing the drain region in the first direction, and
wherein a crystal plane of a third surface of the semiconductor substrate, which is the second side surface of the first trench, is a (111) plane.

5. The semiconductor device according to claim 1,
wherein a depth of the second trench is larger than a depth of the first trench.

* * * * *